(12) United States Patent
Barnard

(10) Patent No.: US 6,191,464 B1
(45) Date of Patent: Feb. 20, 2001

(54) ELECTRICAL ISOLATION OF OPTO-ELECTRONIC DEVICE COMPONENTS

(75) Inventor: Joseph Alan Barnard, London (GB)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/152,577

(22) Filed: Sep. 14, 1998

(30) Foreign Application Priority Data

Nov. 11, 1997 (EP) .................................................. 97309032

(51) Int. Cl.$^7$ .............................. H01L 29/00; H01L 21/76
(52) U.S. Cl. ........................................... 257/427; 438/423
(58) Field of Search ............................. 257/81, 431, 432, 257/433, 436; 438/22, 23, 24, 28, 30, 34, 38, 42, 44, 414, 423

(56) References Cited

U.S. PATENT DOCUMENTS 5,067,809 * 11/1991 Tsubota .................................. 257/81
5,481,559    1/1996 Kawamura .

OTHER PUBLICATIONS

European Search Report, EP 97 30 9032, Apr. 15, 1998.
Journal of Lightwave Technology, vol. 6, No. 6, Jun. 1988, pp. 779–785, M. Suzuki et al, "Electrical and Optical Interactions between Integrated InGasP/InP DFB Lasers and Electroabsorption modulators".
Proceedings of the Conference on Opticalfibre Communication 1995, vol. 8, pp. 25–26, M. Aoki et al, "High–Performance Modulator/Integrated Light Sources Grown by an In–Plane Band–Gap Energy–Control Technique".

* cited by examiner

Primary Examiner—Matthew Smith
Assistant Examiner—Calvin Lee

(57) ABSTRACT

The present invention relates to the electrical isolation of components within an integrated opto-electronic device where two or more active regions are optically coupled, for example by a waveguide. The device includes a distributed feed-back laser diode and an electro-absorption modulator fabricated on the same substrate. The laser diode and modulator are: separated by an electrical isolation region; linked optically across the isolation region by a waveguide; and capped by a ternary cap layer through which ohmic contacts are made to operate the components. The cap layer extends to the isolation region from which a grounding contact is made to ground the cap layer in the isolation region and so to electrically isolate the laser diode and modulator from each other.

22 Claims, 2 Drawing Sheets

ELECTRICAL ISOLATION OF OPTO-ELECTRONIC DEVICE COMPONENTS

The present invention relates generally to the electrical isolation of components within an integrated opto-electronic device where two or more active regions are optically coupled, for example by a waveguide. The invention particularly relates to isolation of a distributed feed-back (DFB) laser diode and an electro-absorption (EA) modulator in a monolithically integrated opto-electronic transmitter device for a fibre-optic telecommunications link.

Opto-electronic integration gives the potential for low cost, reliable and compact components, improved temperature and mechanical stability, and assured alignment between components. In the field of transmitter devices for fibre-optic communications, the integration of a laser diode with a modulator, for example in a buried heterostructure or a ridge stripe, was achieved many years ago, for example see the publication by S. Tarucha and H. Okamoto in Appl. Phys. Lett., vol. 22, pp. 242–243, 1986 relating to a device fabricated from GaAs. Nowadays, in order to achieve operation at 1.55 μm, such integrated opto-electronic transmitter devices are usually fabricated from on a wafer grown from an $n^{++}$-InP substrate on which are grown a number of layers, including a $p^+$-InP active layer capped by a $p^{++}$-GaInAs ternary or cap layer. The cap layer has a relatively low resistance, and so serves as a contact layer to which electrical contacts may be made.

Ideally, the light output from the laser diode should have a steady wavelength and intensity. However, because of the integrated nature of such structures, and close physical proximity of the components, the electrical resistance between the laser diode and modulator (referred to herein as the isolation resistance) will be about 1–10 k$\Omega$, depending on the conductivity of the p-contact material and the separation of the contacts. It is therefore possible that the electrical signal used to modulate the modulator can inadvertently affect the laser diode, causing wavelength and/or intensity shifts. The isolation resistance therefore needs to be increased, at least to a few 100 k$\Omega$, and preferably to a few M$\Omega$.

Several approaches have been suggested to deal with this problem of electrical isolation. One approach is to etch through the ternary cap layer. This increases the isolation resistance only to about 10–20 k$\Omega$. Although such etching does not interfere with the optical waveguide between the laser diode and the modulator, this is insufficient isolation.

One way to achieve sufficient isolation is disclosed in the publication by M. Suzuki et al in the Journal of Lightwave Technology, vol. 6, pp. 779–785. An isolation region is formed in the stripe, between the DFB laser diode and the EA modulator, by etching away both the cap and active layers. The gap in the active layer was then filled with a passivating SiN film and a polyimide. Although a relatively high isolation resistance of 2.5 M$\Omega$ was achieved, this approach suffers from the disadvantage of cutting into the optical waveguide between the laser diode and modulator, which may adversely affect the optical efficiency of the device or reduce coupling between the components owing to unwanted internal reflections.

Another way to achieve a high degree of electrical isolation, without etching away the cap and active layers and without adversely affecting the optical performance of the device, is to use deep proton implantation in the region between the laser diode and the modulator. M. Aoki and H. Sano have reporting in "OFC '95 Optical Fibre Communication, Summaries of Papers Presented at the Conference on Optical Fibre Communication, vol. 8, pp. 25–26, pub. Optical Society of America 1995", that this technique can achieve an electrical isolation of greater than 1 M$\Omega$. It is believed that this approach could achieve an isolation resistance of up to 10 M$\Omega$. However, none of the other process steps associated with the fabrication of such an integrated opto-electronic device require any such proton or ion implantation, and so this approach requires an investment in an additional item of very expensive production equipment.

According to the invention, there is provided an integrated opto-electronic device, comprising at least two opto-electronic components fabricated on the same substrate, two of the components being: separated by an electrical isolation region; linked optically across the isolation region by a waveguide; and capped by a contact layer through which ohmic contacts are made to operate the components, characterised in that the contact layer extends to the isolation region from which a grounding contact is made to ground the contact layer in the isolation region and so electrically isolate the two components from each other.

The grounding contact may then draw any stray currents from one of said two components which could adversely affect the performance of the other of said component. In the case of the component being a laser diode, and the other component being a modulator, for example an EA modulator, for modulating the output of the laser diode, stray modulation currents at the modulation frequency may be drawn to the grounding contact in order to prevent wavelength or intensity chirping of the otherwise steadily biased laser diode.

The contact layer may be broken or cut through, at least partially, in order to help block current flow from one component to another component. Preferably, however, the contact layer extends contiguously in the isolation region between said two components.

In a preferred embodiment of the invention, a passivating layer covers the cap layer in order to provide environmental protection for the device. The passivating layer may then have contact windows in the passivating layer through which the contacts are made.

In general, the integrated device will have a ground plane, for example either the substrate or a layer grown on the substrate. In many cases, the device will be fabricated so that the substrate is a ground plane. The grounding contact from the cap layer may then be made to the ground plane. If a contact window is provided to the substrate, then the grounding contact may conveniently be made through this window to the ground plane. It would however, be possible for the grounding contact to be made, for example by a wire, or some other suitable grounding point. The ground plane need not necessarily be a zero volts with respect to the earth, but will be at a suitable potential with respect to the components in order to draw stray currents away from one or more of the components. However, it may be the case that at least one of the components is grounded by the ground plane.

It may often be the case that a passivating layer extends over the device, and in a preferred embodiment of the invention, this device passivating layer is contiguous with the cap passivating layer. The window to the substrate may then extend through the device passivating layer in order to provide a convenient route to the ground plane.

It may be convenient to fabricate one or each of the contacts by depositing a conducting layer, rather than by using wires. This deposited conducting layer may then cover over one or more windows. Preferably the contacts are deposited so that the contacts cover over fully all of the contact windows. The deposited conducting layer(s) may then act as a type of passivating layer in the area of the windows not otherwise protected by the aforementioned passivating layer.

It may be desirable to limit the stray currents drawn by the grounding contact, for example in order to prevent overheating due to ohmic losses, or to avoid a voltage drop for the components. Therefore, a resistance may be provided in line with the current path to ground. At least part of this resistance may conveniently be provided by the cap layer, which may be fabricated with dimensions depending on the material of the cap layer to give at least 1 k$\Omega$ between a component and the ground contact.

The invention will now be described by way of example, with reference to the accompanying drawings, in which.

Figure 1:
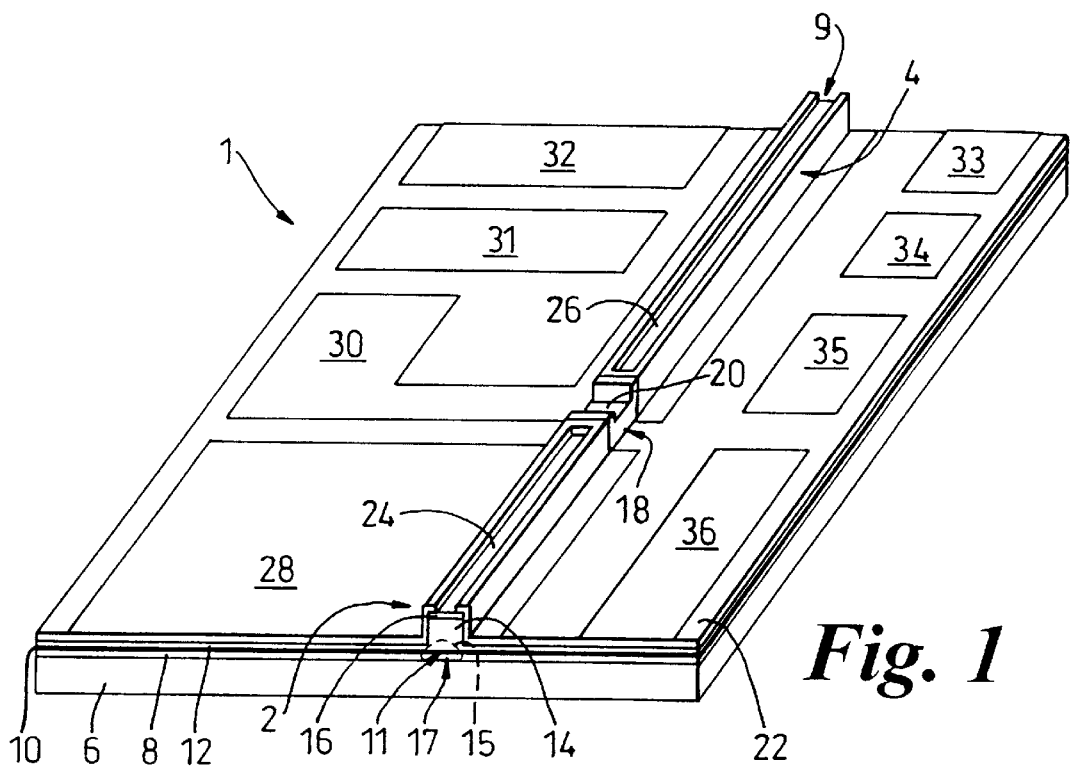
FIG. 1 is a perspective view of a prior art integrated opto-electronic device comprising a DFB laser diode in line with an EA modulator.

FIG. 1 shows, not to scale, an integrated prior art opto-electronic device 1 comprising two components, namely a DFB laser diode 2 and an EA modulator 4, suitable for use as a transmitter in a high speed fibre-optic link operating at 1.55 $\mu$m. Currently, high speed links operate at 2.5 or 10 Gbits/s, and bit rates of up to 40 Gbits/s have been demonstrated in the laboratory.

The device 1 is grown in wafer form, from an $n^{++}$-InP substrate 6 doped to around $10^{19}$/cc, on which is grown a 2 $\mu$m thick $n^+$-InP buffer layer 8 doped to around $10^{18}$/cc. The laser diode has an $In_xGa_{1-x}As_{1-y}P_y$ active layer 10 which is about 100 nm to 300 nm thick, and this is topped by another buffer layer 12, here a "cladding" layer formed from $p^+$-InP. The DFB grating for the laser diode can be contained in the $n^+$-InP buffer layer or in the $p^+$-InP cap layer. The active region of the DFB laser and the EA modulator usually comprises a multiple quantum well (MQW) structure. The MQW structure is especially advantageous in the modulator section where the absorption edge of the modulator can be shifted towards longer wavelengths by the application of an electric field (the quantum confined Stark effect).

The output facet 9 of the modulator is anti-reflective coated for good transmission through the facet, and the back facet 11 of the laser diode may be reflectively coated or left uncoated.

The cladding or upper buffer layer 12 is grown to be about 2 $\mu$m thick, on top of which a 100 nm to 200 nm thick cap layer is deposited. The cap layer is formed from $p^{++}$-GaInAs, highly doped to around $10^{19}$/cc, in order to provide a good low resistance ohmic contact for the electrical connection to the laser diode 2. Then, using well-known fabrication technology, the wafer is coated with an oxide layer, here SiO2 (not illustrated) deposited by in a plasma enhanced chemical vapour deposition (PECVD) process. This oxide layer is photolithographicly patterned and dry etched to remove the cap layer 16 and all but 200 nm of buffer layer except along a 3 $\mu$m wide ridge stripe 14. The ridge stripe 14 therefore rises about 2 $\mu$m above the surrounding surface. Finally the PECVD oxide layer is removed from the ridge stripe 14 to expose again the cap layer 16.

The ridge stripe 14 has the effect of guiding an optical mode 15 along an active region 17 beneath the ridge stripe 14.

The ridge stripe 14 extends from the laser diode 2 towards the EA modulator 4 through an isolation region 18. The EA modulator has a similar structure to that described for the laser diode, except that the absorption edge of the unbiased modulator is at a shorter wavelength (typically 30 nm to 100 nm shorter) than the gain maximum and the emission wavelength of the laser diode.

The isolation region 18 comprises a gap 20 etched in a process similar to that described above to remove completely the cap layer 16, and if needed the top of the upper $p^+$-InP buffer layer 12. The etching of the gap 20 stops short of the depth which would cause reflections and interfere with light guided by the active region 17 extending underneath the ridge stripe 14. Because of the need to maximise the isolation resistance without adversely affecting the optical properties of the ridge waveguide, and also the need to align the photolithographic pattern with the ridge stripe 14 between the components 2,4, the positioning and etching of the gap is a highly critical process. It is very difficult to achieve this alignment in a production environment. The isolation region 18 so produced approximately doubles the isolation resistance between the laser diode 2 and modulator 4. Proton implantation could be used to increase this isolation resistance further to 1–10 M$\Omega$.

The cap layer 16, the sides of the ridge stripe 14, and the surrounding upper buffer layer 10 are then coated with a PECVD oxide layer 22, here an $SiO_2$ layer. This is pattered and etched in a similar process to that described above, to open up two contact windows on the ridge stripe 14, one 24 above the laser diode and the other 26 above the modulator.

Metal is then vacuum deposited on the device 1 using well known techniques in two stages, first with a TiPt layer which is patterned using a lift-off process, and then final depositing of a TiAu layer, followed by metal wet etch in a photolithographically defined areas. The remaining TiAu layer forms two contacts 28, 30 which cover over the contact windows 24, 26 to make good ohmic contacts through the cap layer with the laser diode 2 and modulator 4. Six other metalised areas 31–36 are also formed that do not make any electrical connection but onto which pads (not shown) may be plated in order to provide physical protection to the ridge stripe 14.

Although not illustrated, the substrate 6 would be soldered onto a heat sink in a conventional manner.

The prior art device 1 is about 700 $\mu$m long (ie in the direction of the ridge 14) and about 300 $\mu$m wide. The lengths of the laser diode 2, gap isolation region 18 and modulator 4 are, respectively about 450 $\mu$m, 50 $\mu$m and 200 $\mu$m.

Figure 2:
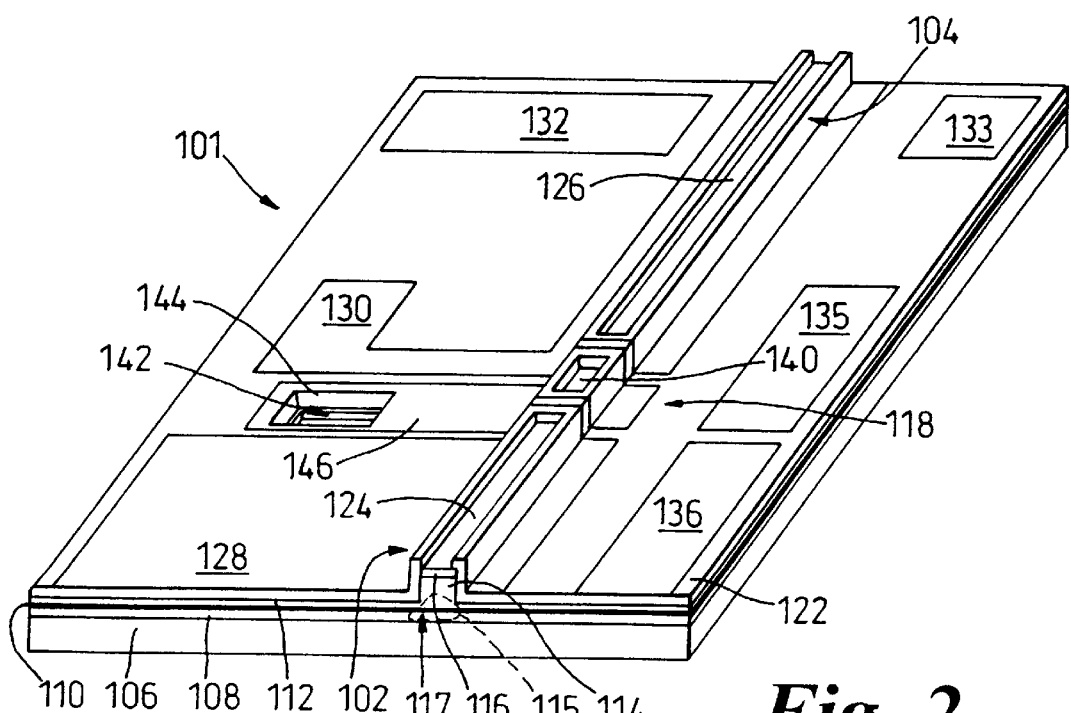
FIG. 2 is a perspective view of an integrated opto-electronic device according to the invention, comprising a DFB laser diode in line with an EA modulator, separated by an isolation region from which a grounding contact is made to a ground plane.
Figure 3:
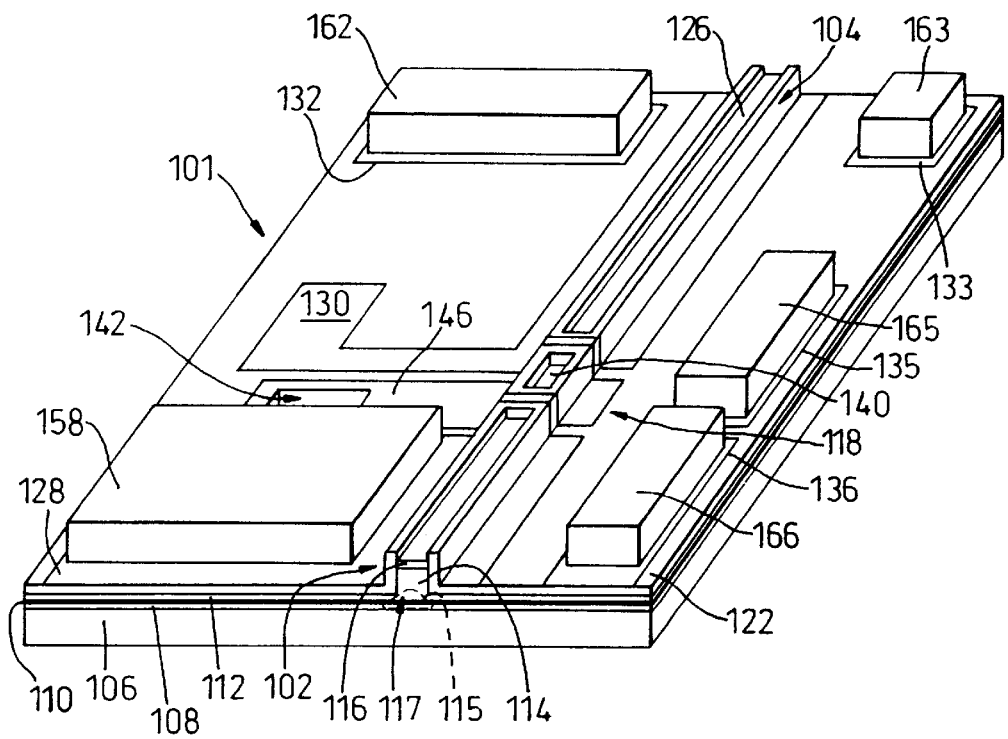
FIG. 3 is a perspective view of the device of FIG. 2, shown with plated pads affixed to the device.

FIGS. 2 and 3 illustrate, not to scale, an integrated opto-electronic device 101 according to the invention. This device 101 is similar to the prior art device 1 described above, and so similar features are indicated with reference numerals incremented by 100.

The device 101 has an isolation region 118 that is about 70 $\mu$m in length, and so is slightly longer than the prior art 18 isolation region. This allows sufficient space for an isolation contact window 140 formed to an unbroken cap layer 116 extending between the laser diode 102 and the modulator 104. The isolation contact window 140 is formed in the same manner and at the same time as the contact windows 124,126 for the components 102,104. This is much more convenient than the formation of the isolation gap described above, avoiding the need to align the isolation region in a separate process step from the alignment of the contact windows.

In a separate process step prior to etching of the contact and isolation windows, a ground contact window 142 to the substrate is formed into the device, passing through the buffer layers 108,112, active layer 110 and about 2 $\mu$m into the 100 $\mu$m thick substrate 106. At this level, the substrate is an effective ground plane for the components 102,104. Then, during the deposition of the PEVCD oxide layer 122 over the cap layer and surface either side of the ridge, the sides 144 and base (not shown) of the of the ground window 142 are also covered in the oxide layer. The oxide covering the base of the ground window 142 is then removed in the same process step which opens up the contact 124,126 and isolation 140 windows.

In one level of fabrication, a TiPt/TiAu conductor 146 is deposited between the isolation contact window 140 and the ground contact window 142, at the same time as the component conductors 128,130 are deposited. A 10 $\mu$m gap separates the conductors 128,130 from the ground conductor 146. This method is quite convenient as there are no additional process steps. It has been observed, however, that for devices created under. particular processing conditions, the junction between the TiPt and the n++ substrate, that the junction behaves like a Schottky diode. It is therefore preferred if the portion of the conductor 146 away from the ridge stripe 114 is formed in a separate process step from a single layer of AuGeNi or AuSn alloy.

Although it would be possible to provide a path to ground other than by depositing the conductor 146 from the isolation contact window 140 to the ground contact window 142, for example with a free-standing, grounded wire bonded to the isolation contact window, the integrated construction described above is believed to be particularly advantageous because it facilitates conduction of very high frequency (of the order 1–10 GHz, or even higher) stray currents induced by the modulation.

The device described above is of relatively low integration density. Because of the ample space afforded by the area to the left side (as drawn) of the ridge, the ground window 142 can be relatively large compared with the contact 124,126 and isolation 140 windows. In this example, the ground window is 50 $\mu$m wide (in the direction of the ridge stripe 114) and 100 $\mu$m long. The alignment of the ground window with respect to the other features is therefore not as critical as the alignment of the cap layer gap 20 of the prior art device. Furthermore, the depth of the ground window is not critical in order to achieve a good path to ground in the substrate 106. This embodiment of the device is therefore very well suited to a production environment.

Referring now to FIG. 3, an Au contact pad 158 is plated to metalised area 128, and Au protective pads 162,163,165, 166 are plated to metalised areas 132,133,135,136. Contact pad 158 is provided only to facilitate initial testing of the laser diode. After testing, the device may then be packaged in an industry standard package (not shown), with a single mode optical fibre coupled with a spherical lens to the output facet of the modulator 104, and with gold bond wires soldered onto metalised areas 128 and 130

Figure 4:
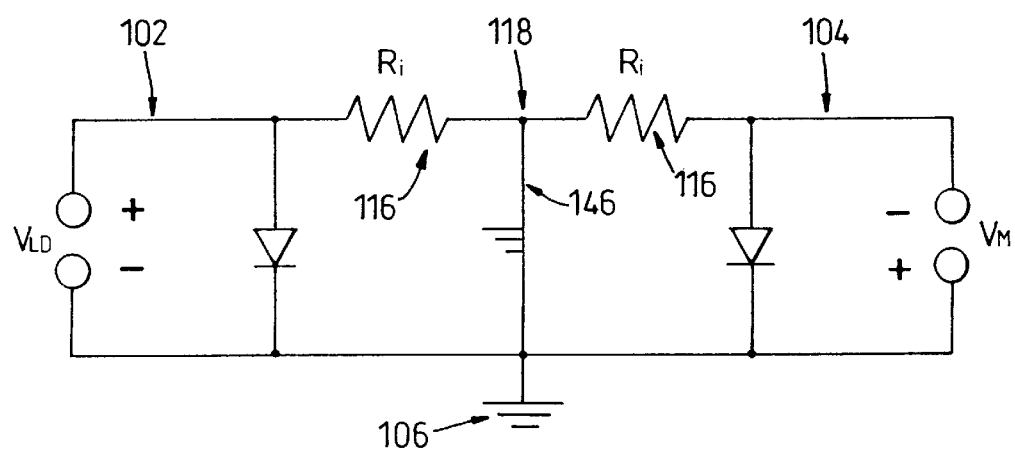
FIG. 4 is a circuit diagram of the device of FIGS. 2 and 3, showing how the grounding contact isolates the two components.

For convenience, the same reference numbers as used above are used in FIG. 4 to refer generally to equivalent circuit elements. FIG. 4 shows electrically how the isolation region 118 helps to isolate the steady laser diode 102 from electrical disturbance from the modulator 104.

The laser diode is forward biased by a $V_{LD}$ at about 1.6 V, and the modulator is reverse biased with a modulation $V_M$, modulated between −0.5 V (transmissive) and −2.0 V (absorptive) at up to 10 Gbit/s, or higher. In the absence of an isolation feature, a stray current from the laser diode 102 to the modulator 104, varying between about 0.5 mA and 0.9 mA, would cause wavelength or intensity chirping of the laser.

The unbroken cap layer 116 between the laser diode 102 and modulator 104, provides a relatively low resistance path $R_i$ path to the isolation window, and to the substrate ground 106 through the conductor 146. Any stray currents in the cladding or upper buffer layer 112, which has a resistivity of $5 \times 10^{-4}$ (about ten times higher than that for the cap layer) will also be drawn toward the cap layer 116 between the components 102,104, and from there to ground 106. In the present example, the value of $R_i$ is preferred to be about 2–3 k$\Omega$. A value for $R_i$ below about 1 k$\Omega$ could cause excessive heating of the laser diode, leading to a wavelength shift of the laser diode.

Although the present invention has been described specifically for the example of a DFB laser diode in line with an EA modulator, the invention is applicable to any pair or number of opto-electronic components monolithically integrated on a substrate, where stray currents from one component need to be isolated from another component. For example, an optical waveguide with a split into two waveguides at a Y-junction, may have electrically driven or modulated active optical regions in two or three of the arms of the "Y", for example an optical amplifier or modulator. It may then be desirable to provide an isolation region at the junction of the three arms with which to electrically isolate the two or three optically active regions.

Another example of an opto-electronic device where there is a need for electrical isolation between optically coupled components would be tunable DFB laser diodes. These may be formed from two or three in-line sections, with a tunable Bragg grating section adjacent to a steady state amplification section.

Opto-electronic devices according to the invention provide a convenient and economical means of electrically isolating integrated opto-electronic components. The process steps involved may be similar to other standard steps used in the fabrication of such devices. There is no need for additional expensive processing equipment not used in other steps, such as ion beam implantation equipment. The tolerances in the alignment of the isolation region, and grounding contacts or windows may be reduced compared with those of prior art isolation regions.

What is claimed is:

1. An integrated opto-electronic device, comprising at least two opto-electronic components fabricated on the same substrate, two of the components being: separated by an electrical isolation region; linked optically across the isolation region by a waveguide; and capped by a contact layer through which ohmic contacts are made to operate the components, characterised in that the contact layer extends through the isolation region from which a grounding contact is made to ground the contact layer in the isolation region and to electrically isolate the two components from each other.

2. An integrated opto-electronic device as claimed in claim 1, in which the contact layer extends contiguously between said two components.

3. An integrated opto-electronic device as claimed in claim 1, in which one of said two components is a laser diode, and the other of said two components is a modulator for modulating the output of the laser diode.

4. An integrated opto-electronic device as claimed in claim 1, in which the contact layer is covered by a passivating layer, the passivating layer having contact windows through which the contacts are made.

5. An integrated opto-electronic device as claimed in claim 1, in which the device has a ground plane, the grounding contact from the contact layer being made to the ground plane.

6. An integrated opto-electronic device as claimed in claim 5, in which a contact window is provided into the device for the grounding contact to the ground plane.

7. An integrated opto-electronic device as claimed in claim 6, in which a passivating layer extends over the device, the window into the device extending through said passivating layer.

8. An integrated opto-electronic device as claimed in claim 5, in which at least one of said components is grounded by the ground plane.

9. An integrated opto-electronic device as claimed in claim 1, in which the contacts are each made by a deposited conducting layer.

10. An integrated opto-electronic device as claimed in claim 9, in which a contact window is provided into the device for the grounding contact to the ground plane and wherein the deposited conducting layer covers over one or more windows.

11. An integrated opto-electronic device as claimed in claim 1, in which the contact layer is a ternary cap layer.

12. An integrated opto-electronic device, comprising at least two opto-electronic components fabricated on the same substrate, two of the components being: separated by an electrical isolation region; linked optically across the isolation region by a waveguide; and capped by a contact layer through which ohmic contacts are made to operate the components, characterised in that the contact layer extends to the isolation region from which a grounding contact is made to ground the contact layer in the isolation region and to electrically isolate the two components from each other, in which the contact layer provides a resistance of at least 1 k$\Omega$ between a component and the ground contact.

13. An integrated opto-electronic device as claimed in claim 12, in which the contact layer extends contiguously between said two components.

14. An integrated opto-electronic device as claimed in claim 12, in which one of said two components is a laser diode, and the other of said two components is a modulator for modulating the output of the laser diode.

15. An integrated opto-electronic device as claimed in claim 12, in which the contact layer is covered by a passivating layer, the passivating layer having contact windows through which the contacts are made.

16. An integrated opto-electronic device as claimed in claim 12, in which the device has a ground plane, the grounding contact from the contact layer being made to the ground plane.

17. An integrated opto-electronic device as claimed in claim 16, in which a contact window is provided into the device for the grounding contact to the ground plane.

18. An integrated opto-electronic device as claimed in claim 17, in which a passivating layer extends over the device, the window into the device extending through said passivating layer.

19. An integrated opto-electronic device as claimed in claim 16, in which at least one of said components is grounded by the ground plane.

20. An integrated opto-electronic device as claimed in claim 12, in which the contacts are each made by a deposited conducting layer.

21. An integrated opto-electronic device as claimed in claim 20, in which a contact window is provided into the device for the grounding contact to the ground plane and wherein the deposited conducting layer covers over one or more windows.

22. An integrated opto-electronic device as claimed in claim 12, in which the contact layer is a ternary cap layer.

* * * * *